United States Patent [19]

Zimmermann

[11] 3,890,542

[45] June 17, 1975

[54] VERTICAL DEFLECTION CIRCUIT FOR TELEVISION RECEIVERS

[76] Inventor: Günter J. Zimmermann, Drosselstrasse 12, 8051 Langenbach, Germany

[22] Filed: Aug. 15, 1973

[21] Appl. No.: 388,437

[52] U.S. Cl. .................................. 315/389; 307/228

[51] Int. Cl. ............................................ H01j 29/70

[58] Field of Search ......... 315/27 TD, 27 R, 28, 29, 315/389; 307/228

[56] References Cited

UNITED STATES PATENTS

| | | | |
|---|---|---|---|
| 3,496,407 | 2/1970 | Entenmann | 315/27 TD |
| 3,619,649 | 11/1971 | Hoffman | 307/228 |
| 3,633,043 | 1/1972 | Anthony | 307/228 |
| 3,774,068 | 11/1973 | Yasumatsuya | 315/27 TD |
| 3,774,069 | 11/1973 | Yasumatsuya | 315/27 TD |

*Primary Examiner*—Maynard R. Wilbur
*Assistant Examiner*—J. M. Potenza
*Attorney, Agent, or Firm*—Harold Levine; James T. Comfort

[57] ABSTRACT

Vertical deflection circuit for television receivers which includes a circuit arrangement for generating a saw-tooth control signal and an audio amplifier for driving the deflection coils. The input stage of the audio amplifier includes an inverting input a non-inverting input, with the saw-tooth control signal being applied to the non-inverting input. A negative feed-back signal proportional to the current through the deflection coils is applied to the inverting input of the amplifier thereby effecting a significant increase in the internal resistance of the amplifier. Consequently, the internal resistance of the amplifier presents virtually no damping resistance across the deflection coils during the vertical flyback period, so that the maximum amplitude of the deflection signal can closely approach the value of the available supply voltage to the amplifier.

2 Claims, 3 Drawing Figures

VERTICAL DEFLECTION CIRCUIT FOR TELEVISION RECEIVERS

Figure 1:
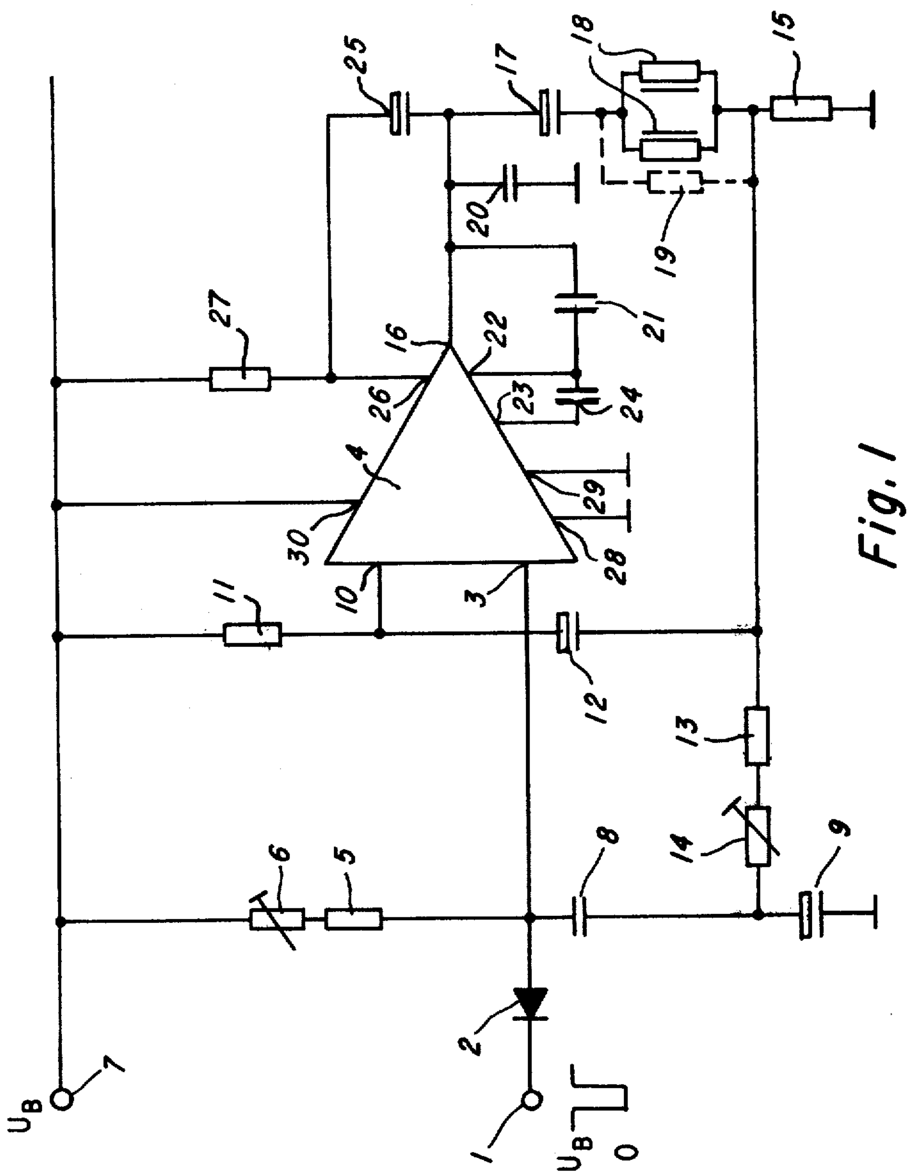

The invention relates to a vertical deflection circuit for picture tubes, such as may be used, for example, in television receivers, comprising a circuit arrangement for generating a saw-tooth control signal and an audio amplifier for driving the vertical deflection coils.

In conventional vertical deflection circuits of this type the deflection coils are greatly damped by the internal resistance of the audio amplifier used during the vertical flyback. As a result, not all the energy which is available in the oscillator circuit formed by the inductance of the deflection coils and their stray capacitance is converted into the deflection signal; part of this energy is dissipated in the internal resistance of the audio amplifier. The supply voltage available is not optimally utilized because the deflection signal does not pass through the total possible voltage sweep but reaches only a smaller maximum amplitude due to the damping.

An object of the invention is to provide a vertical deflection circuit of the above mentioned type which while using economical commercially available components permits optimum utilization of the supply voltage available.

According to the invention this object is achieved by use of a feedback branch for returning a signal proportional to the current through the deflection coils to the input stage of the audio amplifier.

In a vertical deflection circuit constructed according to the invention the return of the signal proportional to the current through the deflection coils to the input stage of the audio amplifier effects a pronounced increase in the internal resistance of the amplifier. As a result, the deflection coils are not damped by the internal resistance of the amplifier during the vertical flyback and consequently the oscillator circuit formed by the inductance of the deflection coils and their stray capacitance can oscillate almost freely during the vertical flyback. In this circuit there is substantially no energy loss due to the internal resistance of the amplifier and therefore the deflection signal can oscillate over the entire range of the supply voltage available. The maximum amplitude of the deflection signal can thus reach the value of the supply voltage. This advantage is particularly noticeable in the case of portable television receivers in which only a battery of low output voltage is available as a supply.

In a specific embodiment of the invention the vertical deflection circuit is constructed in such a manner that the input stage of the audio amplifier consists of a differential stage having an inverting input terminal and a non-inverting terminal, that the output of the circuit arrangement for generating the saw-tooth control signal is connected to the non-inverting input terminal and that the feedback branch is connected to the inverting input terminal.

With this embodiment of the vertical circuit according to the invention an audio amplifier may be used of a type which is made and marketed at low price in integrated form. This considerably cheapens a vertical deflection circuit according to the invention.

Figure 2:
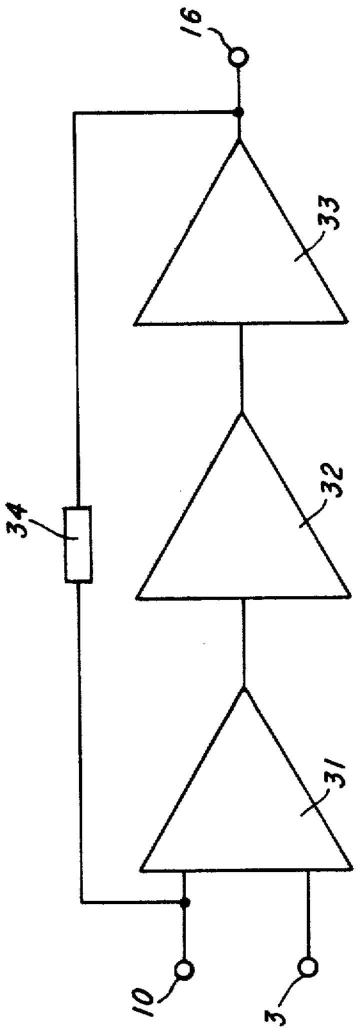
Figure 3:
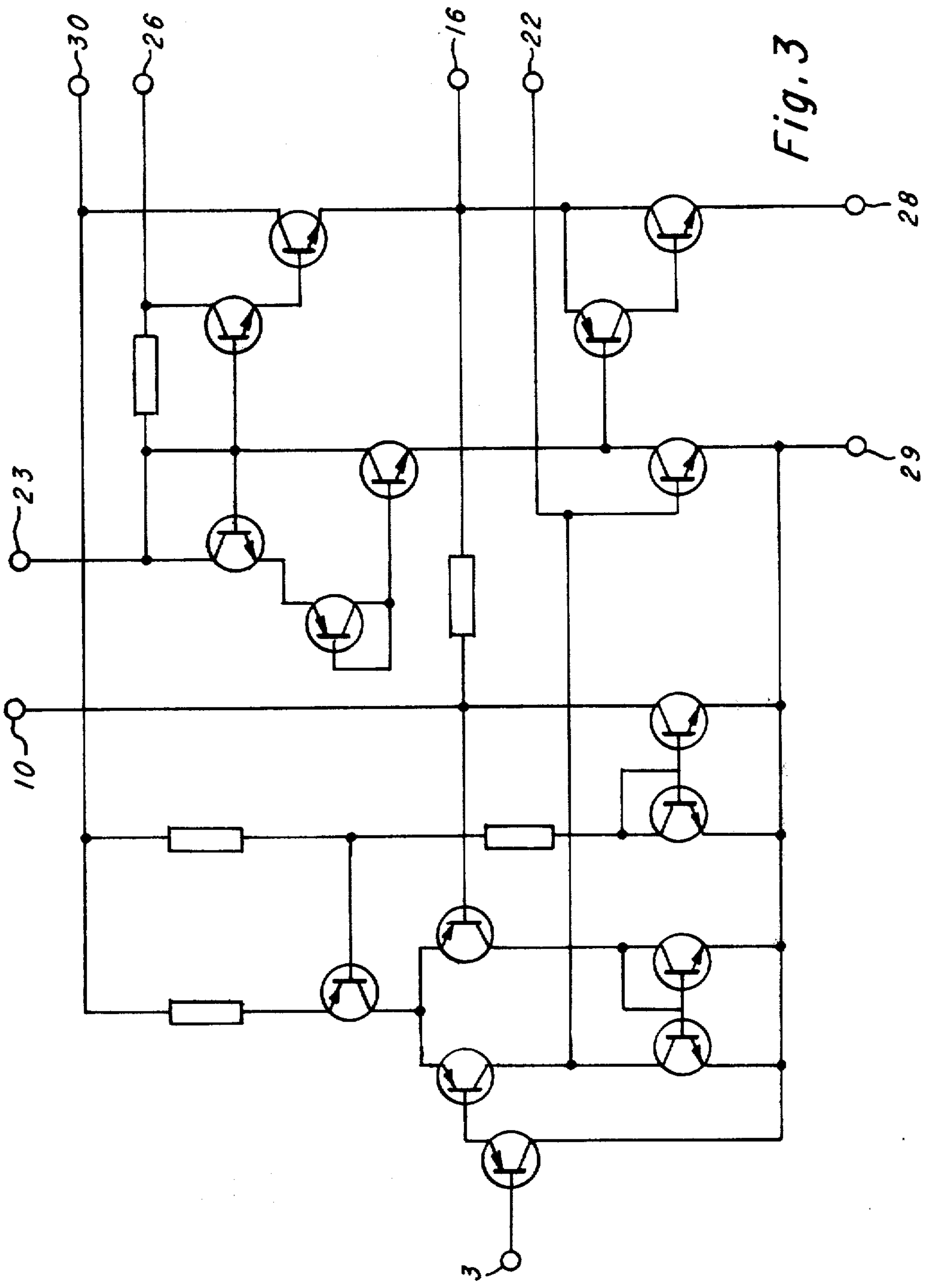

In order that the invention may be more readily understood and put into effect, an embodiment thereof will be described in greater detail with reference to the drawings, wherein:

FIG. 1 is a circuit diagram of a vertical deflection circuit according to the invention, FIG. 2 is a block circuit diagram of an audio amplifier suitable for use in the circuit of FIG. 1 and FIG. 3 is a detailed circuit diagram of audio amplifier used in FIG. 1.

The vertical deflection circuit shown in FIG. 1 includes an input terminal 1 for applying control pulses such as illustrated by the pulse waveform CP. Connected to the input terminal 1 is the cathode of a semiconductor diode 2 whose anode is connected to a non-inverting input 3 of a differential stage forming part of an audio amplifier 4. The input 3 of the audio amplifier 4 is connected via a series circuit comprising a fixed resistance 5 and an adjustable resistance 6 to the positive terminal 7 of a supply voltage $U_B$ and via a series circuit comprising the capacitors 8 and 9 to ground.

An inverting input 10 of the above-mentioned differential stage of the audio amplifier 4 is connected via a resistance 11 to the positive terminal 7 of the supply voltage $U_B$ and also to a capacitor 12 whose other side is connected via a fixed resistance 13 and an adjustable resistance 14 to the junction between the two capacitors 8 and 9, and via another resistance 15 to ground.

A capacitor 17 connects the output 16 of the audio amplifier 4 to two parallel-connected vertical deflection coils 18 whose other ends are connected to ground by the resistance 15. A resistance 19 illustrated in dashed line in FIG. 1 may be connected in parallel with the deflection coils 18.

Also connected to the output 16 of the audio amplifier 4 are a bypass capacitor 20. A neutralizing capacitor 21 is connected between the output 16 and a terminal 22 of the audio amplifier 4 and a further neutralizing capacitor 24 is connected between terminals 22 and 23 of the audio amplifier 4. Furthermore, the output 16 of the audio amplifier 4 is connected via a capacitor 25 to the terminal 26 of the audio amplifier and via a resistance 27 to the positive terminal 7 of the supply voltage $U_B$. Terminals 28 and 29 of the audio amplifier 4 are grounded and a terminal 30 is connected to the positive terminal 7 of the supply voltage $U_B$.

FIG. 2 shows the basic structure of an audio amplifier 4 suitable for use in the circuit of FIG. 1. The audio amplifier shown in FIG. 2 comprises an input stage 31 constructed as differential stage, a driver stage 32 and an output stage 33. The two input terminals of the input stage 31 are the non-inverting input 3 and the inverting input 10 corresponding with the like referenced inputs of the audio amplifier 4 shown in FIG. 1. A resistance 34 connects the inverting input 10 and the output 16. The resistance 34 provides internal symmetry of the audio amplifier, i.e. it ensures that the voltage at the output 16 of the audio amplifier 4 is equal to half the supply voltage $U_B$ in the quiescent state.

An example of a semiconductor circuit which may be employed for the audio amplifier 4 is shown in FIG. 3. Such an internally symmetrical audio amplifier is for example manufactured in integrated form by Texas Instruments Incorporated and sold as type Ser. No. 76,001.

The operation of the vertical deflection circuit illustrated in FIG. 1 is as follows:

To drive the vertical deflection circuit a sequence of rectangular pulses CP is required having a duration of 400 to 800 μs and a recurrence frequency equal to the vertical deflection frequency of the television receiver to be driven. The polarity of the rectangular pulses must be such that the pulse top corresponds in each case to the ground (zero) potential whereas the potential in the pulse spacings is equal to the potential $U_B$ of the positive terminal of the supply voltage. These rectangular pulses may be obtained from a conventional pulse generator as well known in the television art. Such a rectangular pulse CP passes via the diode 2 to the capacitor 8, which is thus completely discharged. At the end of the rectangular pulse the capacitor 8 is recharged via the high-impedance resistances 5 and 6 in a practically linear manner, to the value of the supply voltage $U_B$. With the following rectangular pulse the capacitor 8 is then again discharged. The signal at non-inverting input 3 of the audio amplifier 4 thus has the serrated or saw-tooth form necessary for the vertical beam deflection in the picture tube of a television receiver.

The audio amplifier 4 produces at its output 16 signal that is an amplified replica of the signal applied to the non-inverting input 3. The output signal passes via the capacitor 17 to the vertical deflection coils 18 and during the charging period of the capacitor 8 effects the required vertical sweep, and during the brief discharge period of the capacitor 8 effects the vertical flyback.

The current passing through the deflection coils 18 also flows through the resistance 15 to ground developing a voltage across the resistance 15. This voltage taken from the junction of the resistance 15 and the deflection coils 18, which is fed back via the capacitor 12 to the inverting input terminal 10 of the audio amplifier 4, is therefore directly proportional to the current through the deflection coils 18. This feedback to the inverting input 10 of the audio amplifier 4 represents a current negative feedback which greatly increases the internal resistance of the audio amplifier 4. Consequently, the oscillator circuit formed by the inductance of the deflection coils and their stray capacitance is hardly damped at all of the extremely high internal resistance of the audio frequency during the vertical flyback. As a result substantially the entire oscillator circuit energy is utilized to generate the deflection signal which during the vertical flyback thus passes through the entire available supply voltage.

To prevent a completely free oscillation of the oscillator circuit formed by the inductance of the deflection coils 18 and their stray capacitance a low value resistor 19 may be connected in parallel with the deflection coils.

With the aid of the resistances 5 and 6 the charging voltage at the capacitor 8 and thus the picture amplitude may be adjusted. Via the resistances 13 and 14 a signal dependent upon the output signal of the audio amplifier 4 is returned to the junction between the capacitors 8 and 9. With the aid of this signal the saw-tooth signal at the input 3 of the audio amplifier 4 may be predistorted to compensate for the geometrical deviations which are normally present in television picture tubes.

The insertion of the resistance 11 further contributes to a full utilization of the supply voltage available. As already mentioned, because of its internal symmetry due to the resistance 34, in the quiescent state the audio amplifier 4 would produce an output voltage that is equal to half the operating voltage, and the full value of the supply voltage could not then be utilized for the deflection. The resistance 11 included between the positive terminal 7 of the supply voltage and the inverting input 10 of the audio amplifier 4 cancels out the internal symmetry and reduces the quiescent output voltage of the amplifier so that the supply voltage available at the output of the amplifier can be optimally used.

The circuit arrangement consisting of the capacitor 25 and the resistance 27 also helps to improve the utilization of the supply voltage available. This arrangement, generally referred to as a boot-strap circuit, ensures that the transistors in the output stage 33 of the audio amplifier 4 may be driven to the full amount in that the voltage of the preceding transistor of the driver stage 32 is entrained via the charging voltage of the capacitor 25 in accordance with the modulation of the amplifier output signal.

With the aid of the vertical deflection circuit described herein optimum use is thus made of the supply voltage available and consequently high efficiency is obtained. The picture amplitude, once set by adjustment of the resistance 6, remains constant even on variations of the resistance of the deflection coils due to temperature changes.

What is claimed is:

1. Vertical deflection circuit for a television receiver, including vertical deflection coil means; integrated circuit audio amplifier means having an output connected by capacitor means to one end of said deflection coil means, said amplifier means including a differential input stage having an inverting input and a non-inverting input; a DC supply terminal connected to said amplifier to supply a DC bias voltage thereto; a repetitive saw-tooth deflection control signal generating circuit connected to said non-inverting input; said amplifier being operable to supply deflection current to said deflection coil means in response to said deflection control signal;

a DC supply voltage terminal connected to said amplifier means, and said amplifier means including means for producing internal symmetry of said amplifier such that said amplifier produces a quiescent output voltage equal to about one-half of said supply voltage, resistance means connected externally of said amplifier means between said DC supply terminal and said inverting input to substantially cancel said internal symmetry of said amplifier to reduce the value of said quiescent output voltage so that substantially the whole magnitude of said DC supply voltage is utilized in driving said deflection current through said deflection coil means; said deflection control signal generating means comprising first high value resistance means connected between said DC voltage supply terminal and said non-inverting input and capacitor means connected to said non-inverting input so that said capacitor means is charged from said DC voltage supply terminal through said high value resistor means; and means for applying repetitive pulses to said inverting input to rapidly discharge said capacitor means such that said charging and discharging of said capacitor means generates said repetitive saw-tooth deflection control signal; the other end of said deflection coil means being connected to a reference potential by second resistance means so that current flow through said deflection coil means generates a voltage across said second resistance means proportional to said current; feedback capacitor means connected between said inverting input and the junction between said resistor and said other end of said deflection coil means to feedback to said inverting input a negative feedback current having a magnitude determined by said current flow through said vertical deflection coil means thereby to significantly increase the effective internal resistance of said audio amplifier means and reduce the damping effect thereof on said vertical deflection coil means.

2. Vertical deflection circuit as set forth in claim 1, wherein said high value resistor means is adjustable to provide TV picture amplitude control; and wherein said capacitor means of said deflection control signal generating means comprises two series-connected capacitors, and adjustable resistance means connecting the junction of said second resistance means and said feedback capacitor means to the junction between said series-connected capacitors for TV picture geometry control.

* * * * *